(12) United States Patent
Wang et al.

(10) Patent No.: US 11,862,752 B2
(45) Date of Patent: Jan. 2, 2024

(54) LIGHT-EMITTING DIODE AND METHOD FOR MANUFACTURING THE SAME

(71) Applicant: XIAMEN SANAN OPTOELECTRONICS TECHNOLOGY CO., LTD., Xiamen (CN)

(72) Inventors: Qing Wang, Xiamen (CN); Dazhong Chen, Xiamen (CN); Sheng-Hsien Hsu, Xiamen (CN); Ling-yuan Hong, Xiamen (CN); Kang-Wei Peng, Xiamen (CN); Su-hui Lin, Xiamen (CN); Chia-Hung Chang, Xiamen (CN)

(73) Assignee: Quanzhou San'an Semiconductor Technology Co., Ltd., Nanan (CN)

( * ) Notice: Subject to any disclaimer, the term of this patent is extended or adjusted under 35 U.S.C. 154(b) by 405 days.

(21) Appl. No.: 17/366,268

(22) Filed: Jul. 2, 2021

(65) Prior Publication Data

US 2021/0336080 A1  Oct. 28, 2021

Related U.S. Application Data

(63) Continuation-in-part of application No. PCT/CN2019/076731, filed on Mar. 1, 2019.

(51) Int. Cl.
*H01L 33/10* (2010.01)
*H01L 33/00* (2010.01)
(Continued)

(52) U.S. Cl.
CPC .......... *H01L 33/10* (2013.01); *H01L 33/0095* (2013.01); *H01L 33/12* (2013.01); *H01L 33/24* (2013.01); *H01L 2933/0058* (2013.01)

(58) Field of Classification Search
CPC ..... H01L 33/10; H01L 33/0095; H01L 33/12; H01L 33/24; H01L 2933/0058;
(Continued)

(56) References Cited

U.S. PATENT DOCUMENTS

2019/0051791 A1* 2/2019 Chiu .................. H01L 33/0095
2019/0165206 A1* 5/2019 Chen ...................... H01L 33/10

FOREIGN PATENT DOCUMENTS

CN        101038948 A      9/2007
CN        104678469 A      6/2015
(Continued)

OTHER PUBLICATIONS

Search Report issued to PCT application No. PCT/CN2019/076731 dated Oct. 30, 2019.
(Continued)

*Primary Examiner* — J. E. Schoenholtz
(74) *Attorney, Agent, or Firm* — Thomas | Horstemeyer, LLP

(57) ABSTRACT

A light-emitting diode includes a substrate, a distributed Bragg reflector (DBR) structure and a semiconductor layered structure. The DBR structure is disposed on the substrate. The semiconductor layered structure is disposed on the DBR structure opposite to the substrate, and is configured to emit a light having a first wavelength. The DBR structure has a reflectance of not greater than 30% for the light having the first wavelength, and a reflectance of not smaller than 50% for a laser beam having a second wavelength that is different from the first wavelength.

20 Claims, 8 Drawing Sheets

(51) Int. Cl.
*H01L 33/12* (2010.01)
*H01L 33/24* (2010.01)

(58) Field of Classification Search
CPC ............. H01L 2933/0025; H01L 33/46; H01L 33/007; H01L 33/20
See application file for complete search history.

(56) References Cited

FOREIGN PATENT DOCUMENTS

| | | |
|---|---|---|
| CN | 105655387 A | 6/2016 |
| CN | 108832484 A | 11/2018 |

OTHER PUBLICATIONS

Search Report appended to an Office Action, which was issued to Chinese counterpart application No. 201980003933.7 by the CNIPA dated Jun. 30, 2023, with an English translation thereof.

* cited by examiner

LIGHT-EMITTING DIODE AND METHOD FOR MANUFACTURING THE SAME

CROSS-REFERENCE TO RELATED APPLICATION

This application is a bypass continuation-in-part (CIP) application of PCT International Application No. PCT/CN2019/076731, filed on Mar. 1, 2019. The entire content of the international patent application is incorporated herein by reference.

FIELD

The disclosure relates to a semiconductor illuminating device, and more particularly to a light-emitting diode and a manufacturing method thereof.

BACKGROUND

Among various manufacturing processes of light-emitting diode (LED) chips, dicing is a necessary process where a prepared wafer is cut into individual dies of desired size. Dicing technique for LED has developed from mechanical dicing using a diamond dicing saw into laser cutting. There are two main types of laser cutting, namely laser scribing and stealth dicing in which inscribed marks are respectively formed on a surface and interior of the wafer by focusing a laser beam having a specific energy density and wavelength thereon. The wafer is then split along the inscribed marks with a breaking machine. Laser cutting is advantageous because of its high productivity, high yield, easily automated operation and low cost.

Chinese Invention Patent Application Publication No. CN 103943744 A discloses a chip processing method for enhancing light efficiency of LEDs including the steps of:

(1) performing laser scribing on a surface of a wafer to form trenches that extends from the surface to a region near the interface between a substrate and an epitaxial structure;

(2) etching the trenches with an acid solution under high temperature to obtain a desired appearance;

(3) performing stealth dicing on the interior of the wafer to form inscribed marks that corresponds in position to the trenches; and (4) breaking the wafer along the inscribed marks to obtain individual LEE) chips.

Although the abovementioned processing method may enhance brightness of the LED chips produced, there are a few drawbacks of the processing method. For example, the laser scribing in step (1) is required to be well-controlled to obtain a desired depth of the trenches, otherwise the resultant ablated portion of the substrate would undesiredly absorb light which may result in light loss of the LED chips. In addition, each of the inscribed marks is formed in step (3) by multiple scans of the laser along the intended dicing lanes, where the laser beam is required to be focused at depths of the device that are not near the epitaxial structure, which may affect the number of the laser scans, thereby greatly reducing surface roughness of the substrate.

SUMMARY

Therefore, an object of the disclosure is to provide a light-emitting diode and a method for manufacturing the same that can alleviate at least one of the drawbacks of the prior art.

According to the disclosure, the light-emitting diode (LED) includes a substrate, a distributed Bragg reflector (DBR) structure and a semiconductor layered structure. The substrate has an upper surface, a lower surface that is opposite to the upper surface, and a side surface interconnecting the upper surface and the lower surface. The DBR structure is disposed on the upper surface of the substrate. The semiconductor layered structure is disposed on the DBR structure opposite to the substrate, and is configured to emit a light having a first wavelength. The DBR structure has a reflectance of not greater than 30% for the light having the first wavelength, and a reflectance of not smaller than 50% for a laser beam having a second wavelength that is different from the first wavelength.

According to the disclosure, the method for manufacturing the LED includes the steps of:

(a) providing a substrate which has an upper surface and a lower surface that is opposite to the upper surface;

(b) forming a DBR structure on the upper surface of the substrate; and (c) forming a semiconductor layered structure from the DBR structure opposite to the substrate, the semiconductor layered structure being configured to emit a light having a first wavelength.

The DBR structure has a reflectance of not greater than 30% for the light having the first wavelength, and a reflectance of not smaller than 50% for a laser beam having a second wavelength which is different from the first wavelength.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
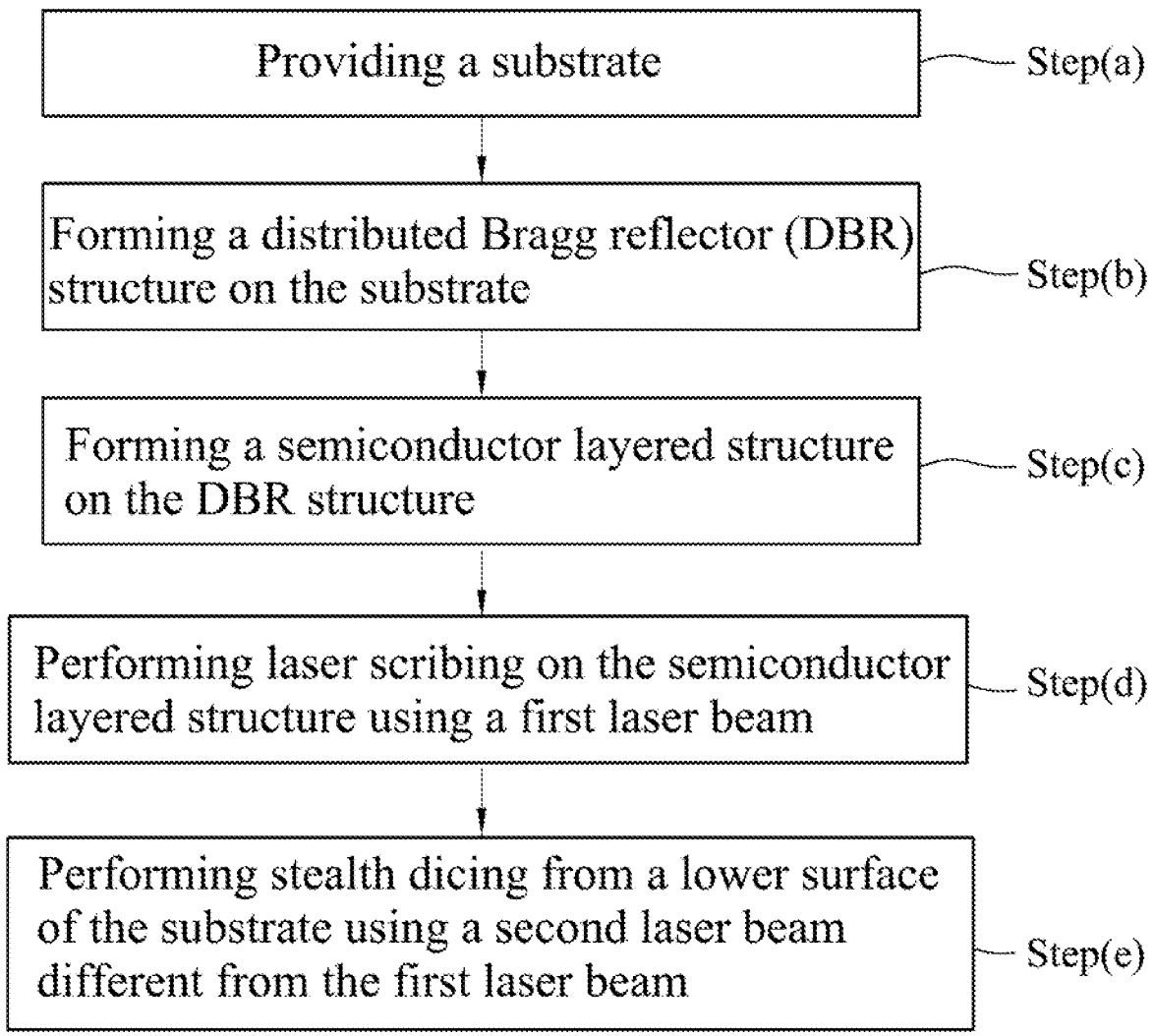
FIG. 1 is a flow chart illustrating an embodiment of a manufacturing method of at least one light-emitting diode (LED) according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, an embodiment of a method of manufacturing at least one light-emitting diode (LED), for instance, a gallium nitride (GaN)-based LED, according to the disclosure includes the following steps.

Figure 2:
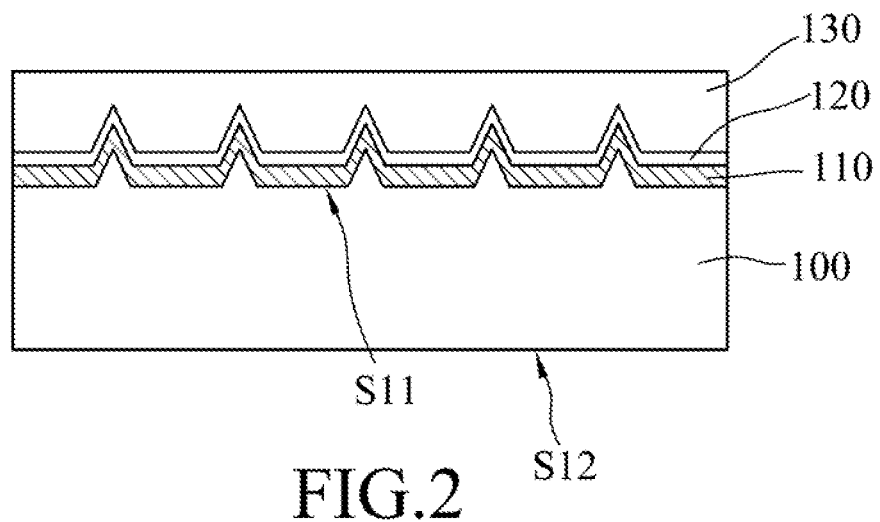
FIGS. 2 to 6 are schematic views illustrating consecutive steps of the embodiment of the manufacturing method of a light-emitting diode (LED) according to the disclosure.

First, in step (a), referring to FIG. 2, a substrate 100 is provided. The substrate 100 has an upper surface S11, a lower surface S12 that is opposite to the upper surface S11, and a side surface S13 that interconnects the upper surface S11 and the lower surface S12.

The substrate 100 may be a growth substrate, or a non-growth substrate. Examples of the substrate may include, but are not limited to, a plain sapphire substrate, a patterned sapphire substrate, a silicon substrate, a silicon carbide substrate, a GaN substrate, and a glass substrate. In this embodiment, the substrate 100 is a patterned sapphire substrate.

Then, in step (b), a distributed Bragg reflector (DBR) structure 110 is formed on the upper surface S11 of the substrate 100. The configuration and composition of the DBR structure 110 according to this disclosure will be described later.

Afterwards, in step (c), a semiconductor layered structure 130 is formed on the DBR structure 110 opposite to the substrate 100 by e.g., metal-organic chemical vapor deposition (MOCVD). The semiconductor layered structure 130 may include an n-type semiconductor layer, an active layer and a p-type semiconductor layer that are sequentially disposed on the DBR structure 110. The semiconductor layered structure 130 is configured to emit a light having a first wavelength. The first wavelength may range from 400 nm to 800 nm, for instance, blue light, cyan light, and green light. The DBR structure 110 may have a reflectance of not greater than 30% for the light emitted from the semiconductor layered structure 130, and a reflectance of not smaller than 50% for another light having a second wavelength which is different from the first wavelength (i.e., not emitted from the semiconductor layered structure 130). In certain embodiments, the another light may be a laser beam suitable for used in a dicing process in the subsequent steps.

In this embodiment, before step (c), the method further includes a step of forming a buffer layer 120 on the DBR structure 110 opposite to the substrate 100 by, e.g. physical vapor deposition (PVD). The buffer layer 120 may be made of an AlN-based material. The buffer layer 120 may have a thickness ranging from 10 nm to 100 nm. The semiconductor layered structure 130 is then formed on the buffer layer 120 opposite to the DBR structure 110 in step (c).

Alternatively, for step (c), in certain embodiments of the method, the semiconductor layered structure 130 which is first epitaxially grown and formed on another substrate (such as a GaAs growth substrate) is transferred to the substrate 100 through a transparent bonding layer formed on the the DBR structure 110, followed by removal of the another substrate. That is, the semiconductor layered structure 130 is bonded to the DBR structure 110 opposite to the substrate 100 through the transparent bonding layer.

Figure 3:
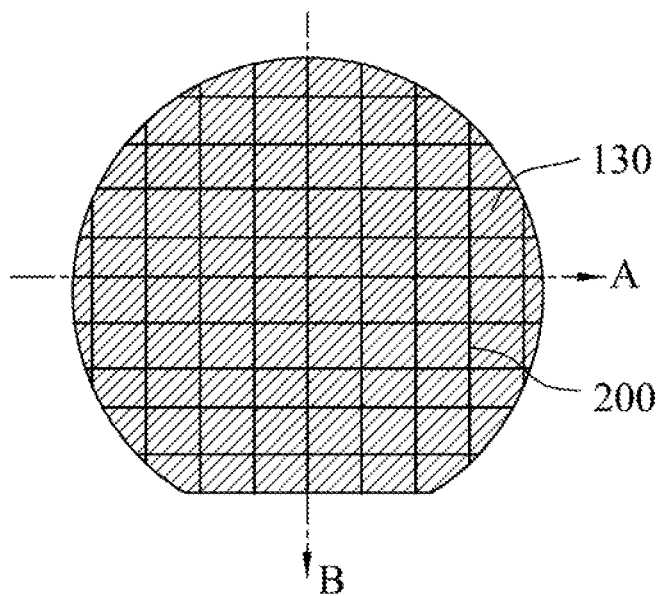
Figure 4:
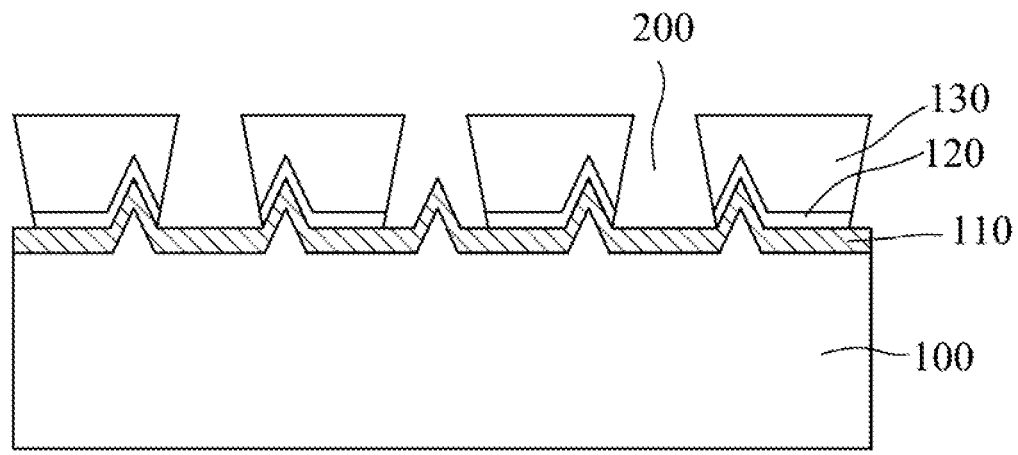

The dicing process which includes the following steps (d) and (e) may be further conducted to cut the product obtained in step (c). Referring to FIGS. 3 and 4, in step (d), laser scribing is performed on the semiconductor layered structure 130 using a first laser beam. The reflectance of the DBR structure 110 for the first laser beam having the second wavelength is not smaller than 50%. For example, the second wavelength of the first laser beam used in laser scribing may be 365135 nm.

Specifically, in this embodiment, step (d) is conducted by laser scanning a top surface of the semiconductor layered structure 130 opposite to the substrate 110 along a first direction (A) and a second direction (B) which traverses (e.g., perpendicular to) the first direction, so as to form scribe trenches 200 in a network form as shown in FIG. 3. Each of the scribe trenches 200 may have a depth ranging from 5 μm to 10 μm, and may extend through the semiconductor layered structure 130 and the buffer layer 120 to expose the substrate 100. The scribe trenches 200 may be further subjected to an etching process using a chemical etching solution, such that the semiconductor layered structure 130 is tapered inwardly toward the DBP structure 110. The buffer layer 120 may also be tapered inwardly toward the DBR structure 110 through an etching process.

Figure 5:
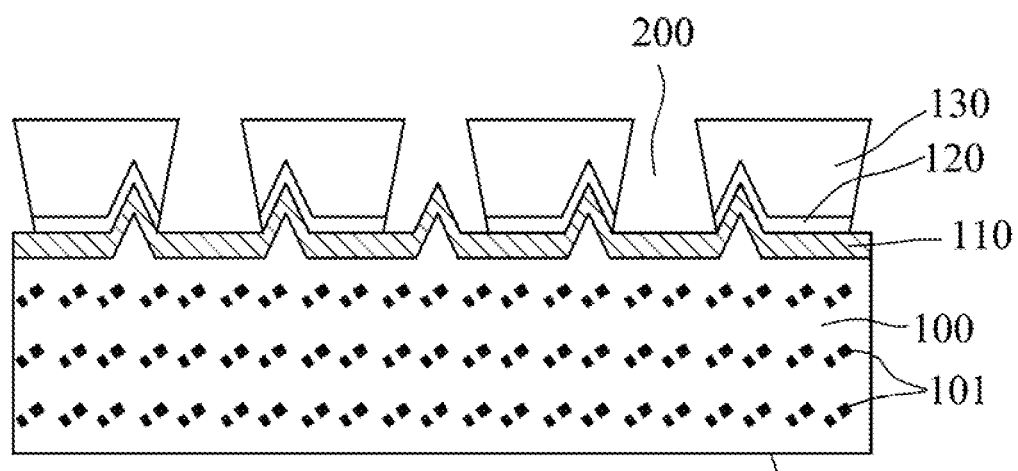

Referring to FIG. 5, in step (e), stealth dicing is performed from the lower surface S12 of the substrate 100 using a second laser beam different from the first laser beam. The reflectance of the DBR structure 110 for the second laser beam is not smaller than 50% (such as not smaller than 60%, or not smaller than 90%). For example, the second wavelength of the second laser beam used in stealth dicing may be 1064±100 nm.

Specifically, during stealth dicing, the second laser beam which is focused on interior parts of the substrate 100 is scanned along dicing lanes corresponding in position to the scribe trenches 200. The scans of the second laser beam may be conducted multiple times depending on a thickness of the substrate 100, where the second laser beam is focused at different depths of the substrate 100, so as to obtain a plurality of inscribed features 101. For example, when the substrate 100 has a thickness of 100 μm to 150 μm, the scans of the second laser beam are scanned at least three times to obtain at least 3 inscribed features 101 at different depths of the substrate 100. When the substrate 100 has a thickness of 150 μm to 200 μm, at least 4 inscribed features 101 are formed by performing laser scans at least four times. When the substrate 100 has a thickness greater than 200 μm, at least 5 inscribed features 101 are formed by performing laser scans at least five times. That is, the inscribed features 101 may be formed in a predetermined pattern. For example, one of the inscribed features 101 that is most adjacent to the upper surface S11 of the substrate 100 may be spaced apart therefrom by a distance less than 20 μm (e.g., 1 μm to 10 μm), or even less than 5 nm. Each of the immediately adjacent inscribed features 101 may be spaced part from each other by 10 μm to 30 μm.

Figure 6:
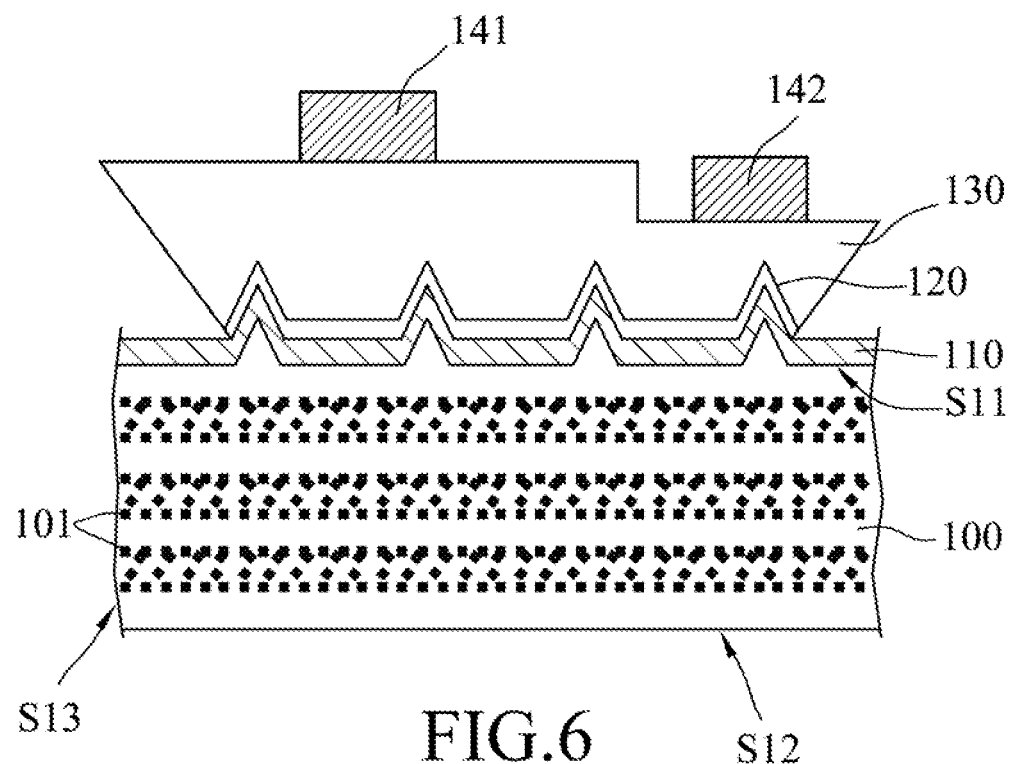

Referring to FIG. 6, after step (d), the semiconductor layered structure 130 is subjected to a photolithographic process using a photoresist mask, such that the n-type semiconductor layer of the semiconductor layered structure is partially exposed. A p-type electrode 141 is disposed on the p-type semiconductor layer, and an n-type electrode 142 is disposed on the exposed n-type semiconductor layer. Then, the substrate 100 may be further subjected to a grinding process, and a breaking process is conducted along the scribe trenches 200 and the inscribed features 101, so as to obtain a plurality of the LEDs of this disclosure. For each of the LEDs thus obtained, the side surface S13 of the substrate 100 may have the inscribed features 101 of stealth dicing. The inscribed features 101 may be evenly distributed throughout the side surface S13 or may be present in a predetermined pattern, as described above, on the side surface S13.

It should be noted that the abovementioned method for manufacturing the at least one LED does not require the adoption of both laser scribing and stealth dicing. In certain embodiments, only the stealth dicing may be performed to form the inscribed features 101 in the substrate 100, followed by the breaking process to form individual LEDs.

According to this disclosure, an embodiment of the light-emitting diode (LED) manufactured by the abovementioned method is provided and includes the substrate 100, the DBR structure 110, and the semiconductor layered structure 130 (see FIG. 6).

The DBR structure 110 is disposed on the upper surface S11 of the substrate 100 and is configured to highly reflect a laser beam used in the desired dicing process, and minimally reflect the light emitted from the semiconductor layered structure 130. In this embodiment, the DBR structure 110 has a reflectance of not greater than 30% (such as not greater than 20% or not greater than 10%) for the light which is emitted by the semiconductor layered structure 130 and which has the first wavelength ranging from 400 nm to 800 nm. The DBR structure 110 has a reflectance of not smaller than 50% (such as not smaller than 60% or about 90%) for the laser beam which may be the one used for the abovementioned dicing process, e.g., laser scribing or stealth dicing. For example, the second wavelength of the laser beam may be 365±35 nm (used for laser scribing) and 1064±100 nm (used for stealth dicing).

Specifically, the DBR structure 110 may include a first layered unit which includes a plurality of pairs of layers, and each pair includes a first high refractive index layer and a first low refractive index layer. The first high refractive index layers and the first low refractive index layers in the first layered unit are alternately stacked.

Each of the first high refractive index layers may be made of a material including, but not limited to $TiO_2$, $Nb_2O_5$, $Ta_2O_5$, $HfO_2$, $ZrO_2$, ZnO, $LaTiO_3$, and combinations thereof. Each of the first low refractive index layers may be made of a material including, but not limited to $SiO_2$, $MgF_2$, $Al_2O_5$, SiON, and combinations thereof.

Each of the first high refractive index layers and the first low refractive index layers may have an optical thickness of $(¼) \times k_1 \times \lambda_1$, wherein 1000 nm$<\lambda_1<$1200 nm, and $k_1$ is an odd number.

In certain embodiments, the first layered unit of the DBK structure 110 may include n pairs of layers, and n≥3 (such as 3, 5, 7, 10, etc.). The reflectance of the DBR structure 110 for the laser beam may be determined by the composition and configuration of the first layered unit. Fox example, when n is 3, in which each of the first high refractive index layers is made of $HfO_2$ and has a thickness of about 126 nm, and each of the first low refractive index layers is made of $SiO_2$ and has a thickness of about 182 nm, the DBR structure 110 may exhibit a reflectance of about 70% for the laser beam having a wavelength of 1064±100 nm. When n=5, the DBR structure 110 may exhibit a reflectance of about 90% for the laser beam having a wavelength of 1064-100 nm. When n=7 or more, the DBF structure 110 may exhibit a reflectance of greater than 90% for the laser beam having a wavelength of 1064±100 nm. While the DBR structure 110 including more pairs of layers may increase reflectance for the laser beam used for laser cutting, such DBR structure 110 may be too thick to be further processed. Thus, in certain embodiments, the DBR structure 110 includes 5 to 18 of the pairs of layers.

In certain embodiments, the DBR structure 110 may further include a second layered unit disposed on the first layered unit opposite to the substrate 100. The second layered unit includes a plurality of pairs of layers, each pair including a second high refractive index layer and a second low refractive index layer and the second high refractive index layers and the second low refractive index layers in the second layered unit being alternately stacked. Each of the second high refractive index layers has an optical thickness different from that of each of the first high refractive index layers, and each of the second low refractive index layers has an optical thickness different from that of each of the first low refractive index layers.

Each of the second high refractive index layers and the second low refractive index layers may have an optical thickness of $(¼) \times k_2 \times \lambda_2$, wherein 350 nm$<\lambda_2<$380 nm, and $k_2$ is an odd number.

Examples of a material for making each of the second high refractive index layers may include, but are not limited to $TiO_2$, $Nb_2O_5$, $Ta_2O_5$, $HfO_2$, $ZrO_2$, ZnO, $LaTiO_3$, and combinations thereof. Examples of a material for making each of the second low refractive index layers may include, but are not limited to, $SiO_2$, $MgF_2$, $Al_2O_5$, SiON, and combinations thereof.

In certain embodiments, the first and second layered units of the DBR structure 110 may respectively include n and m pairs of layers, where n≥3 and m≥2.

In the following examples, different DBR structures 110 with different configuration (i.e., different pairs of layers) are prepared and analyzed to determine the reflectance thereof for light with various wavelengths.

Examples 1 and 2 (E1 and E2)

Figure 7:
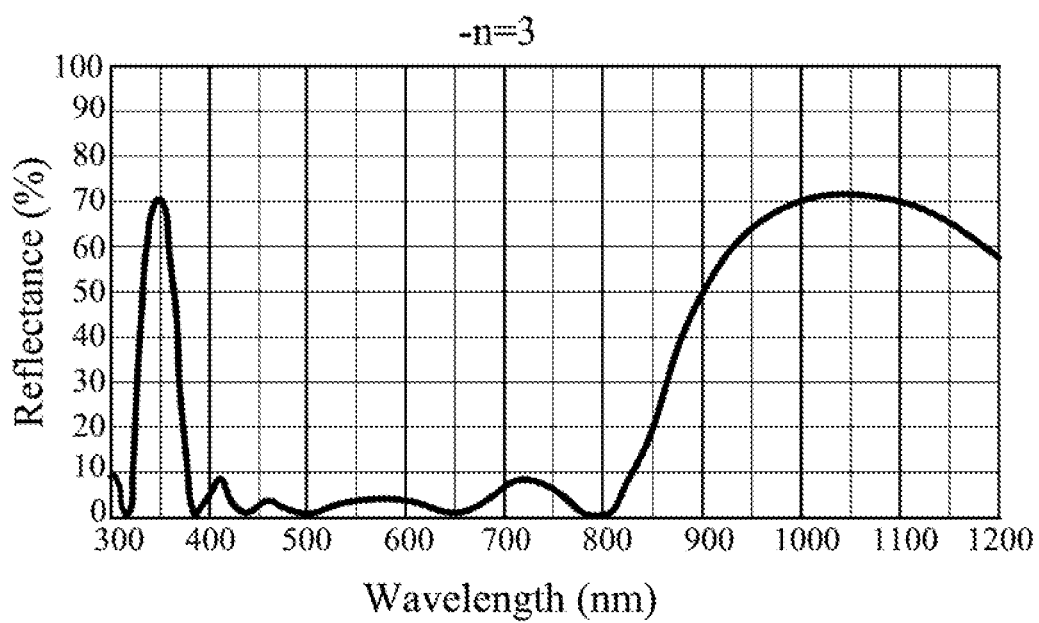
FIGS. 7 to 15 respectively illustrates spectral reflectance of the DBR structures of Examples 1 to 9.
Figure 8:
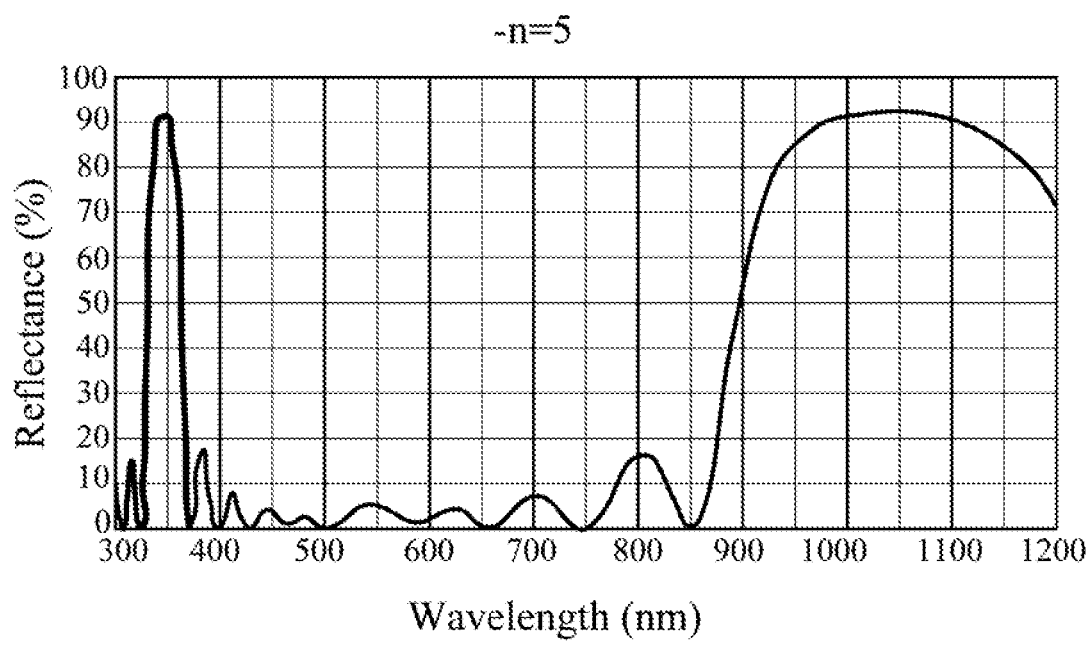

In each of E1 and E2, the DBR structure 110 includes the first layered unit which includes n pairs (n is 3 for E1 and n is 5 for E2) of the first high refractive index layers and the first low refractive index layers. Each of the first high refractive index layers is made of $HfO_2$ (with a refractive index of 2.1) and has a thickness of 126.19 nm (corresponding optical thickness is 265 nm), and each of the first low refractive index layers is made of $SiO_2$ (with a refractive index of 1.46) and has a thickness of 182.80 nm (corresponding optical thickness is 266.89 nm). The results of the spectral reflectance of the DBR structure for E1 and E2 are shown in FIGS. 7 and 8, and are also summarized in Table 1, where for E1 and E2, R1 represents reflectance for 400 nm to 800 nm, R2 represents reflectance for 1000 nm to 1100 nm, and R3 represents reflectance for 350±20 nm.

Examples 3 and 4 (E3 and E4)

The DBR structures 110 of E3 and E4 are generally similar to those of E1 and E2, respectively, except that in E3 and E4, the first layered unit of the DBR structure 110 includes m pairs of layers (m is 3 for E3 and m is 5 for E4), and each of the first high refractive index layers and the first low refractive index layers has an optical thickness of $(¼) \times k \times \lambda$, wherein 350 nm$<\lambda<$380 nm, and k is an odd number.

Figure 9:
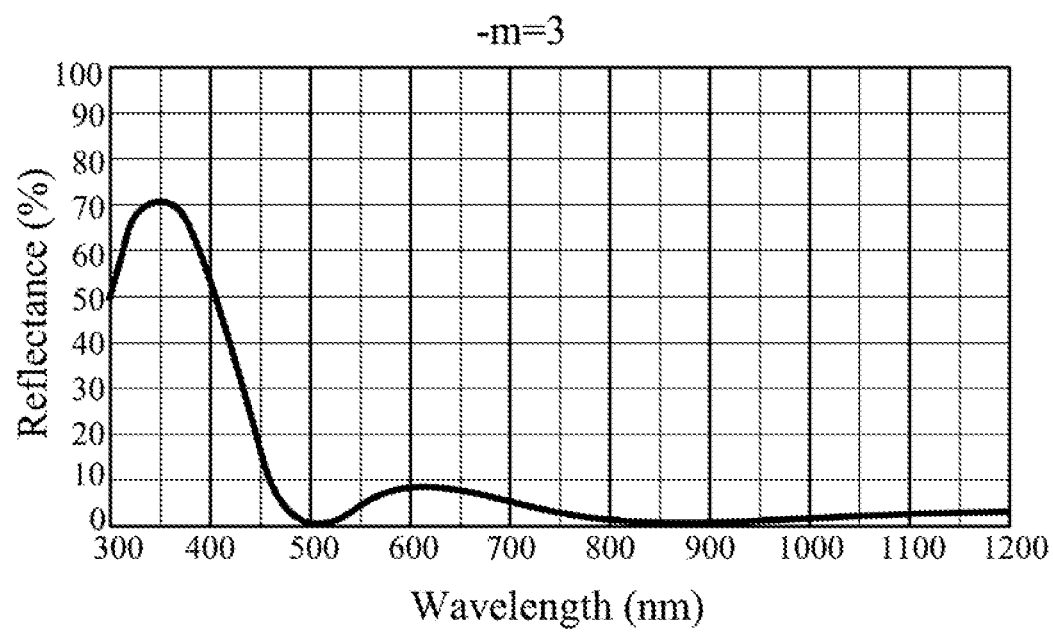
Figure 10:
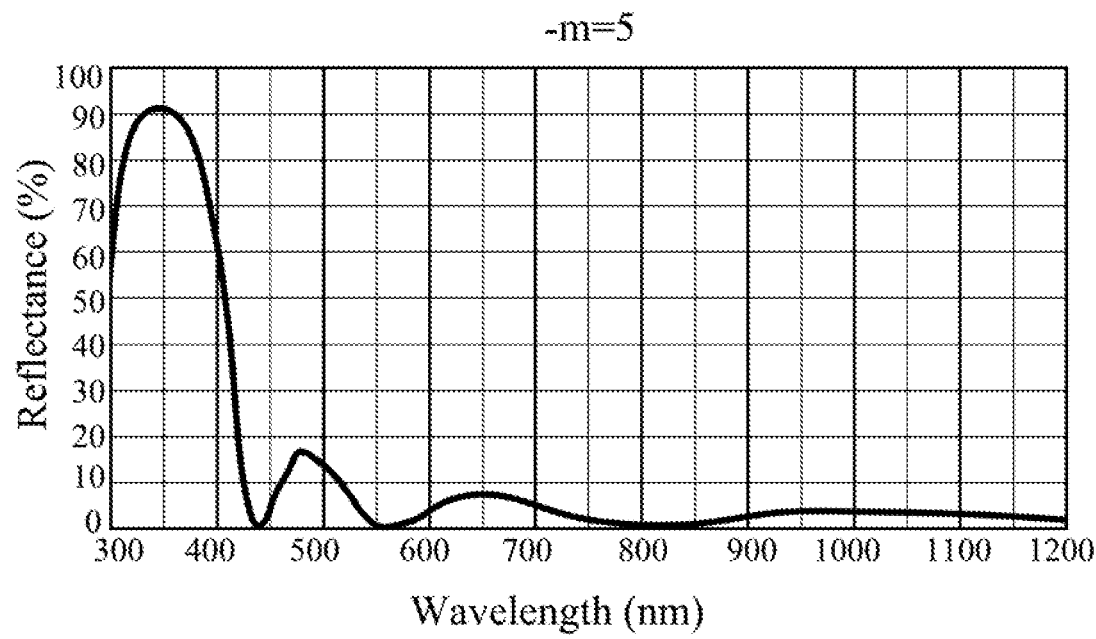

Specifically, each of the first high refractive index layers has a thickness of 42.26 nm (corresponding optical thickness is 88.75 nm), and each of the first low refractive index layers has a thickness of 60.79 nm (corresponding optical thickness is 88.75 nm). The results of the spectral reflectance of the DBR structure for E3 and E4 are shown in FIGS. 9 and 10, and are also summarized in Table 1, where for E3 and E4, R1 represents reflectance for 435 nm to 700 nm, R2 represents reflectance for 1000 nm to 1100 nm, and R3 represents reflectance for 350120 nm.

Examples 5 to 9 (E5 to E9)

The DBR structures 110 of E5 to E9 are generally similar to that of E1, except that in E5 to E9, the DBR structure 110 further includes the second layered unit. That is, in the DBR structures 110 of E5 to E9, the first layered unit includes n pairs of layers and the second layered unit includes m pairs of layers, and the n and m values for each example are shown in Table 1. In addition, each of the first high refractive index layers is made of $HfO_2$ and has a thickness of 126.19 nm (corresponding optical thickness is 265.00 nm), and each of the first low refractive index layers is made of $SiO_2$ and has a thickness of 182.80 nm (corresponding optical thickness is 266.89 nm). Each of the second high refractive index layers is made of $HfO_2$ and has a thickness of 42.26 nm (corresponding optical thickness is 88.75 nm), and each of the second low refractive index layers is made of $SiO_2$, and has a thickness of 60.79 nm (corresponding optical thickness is 88.75 nm). The results of the spectral reflectance of the DBR structure for E5 to E9 are shown in FIGS. 11 to 15, and are also summarized in Table 1, where for E5 to E9, R1 represents reflectance for 435 nm to 700 nm, R2 represents reflectance for 1000 nm to 1100 nm, and R3 represents reflectance for 350120 nm.

TABLE 1

Figure 11:
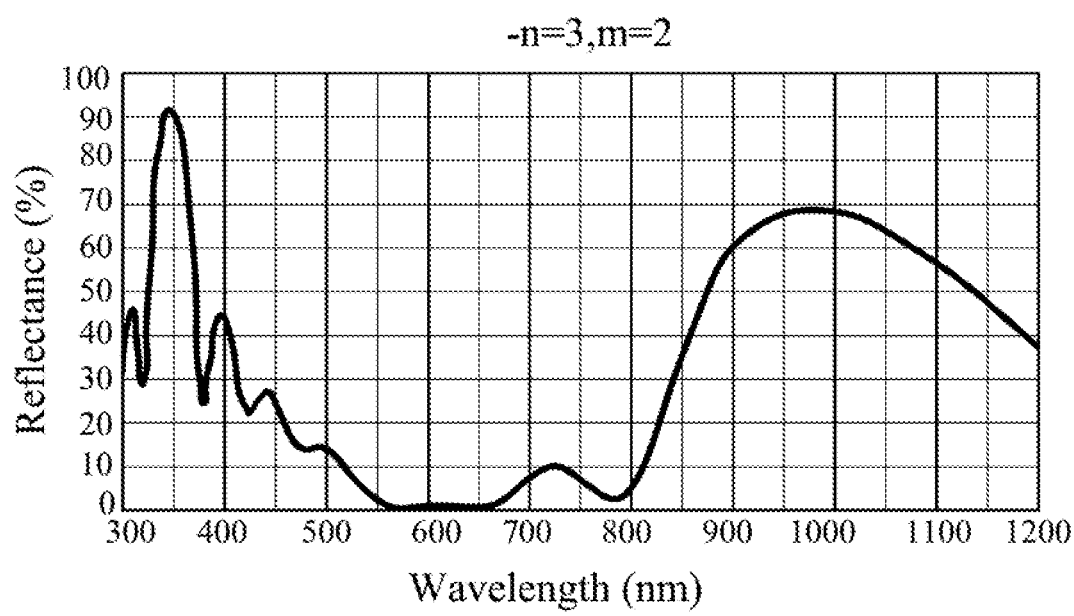
Figure 12:
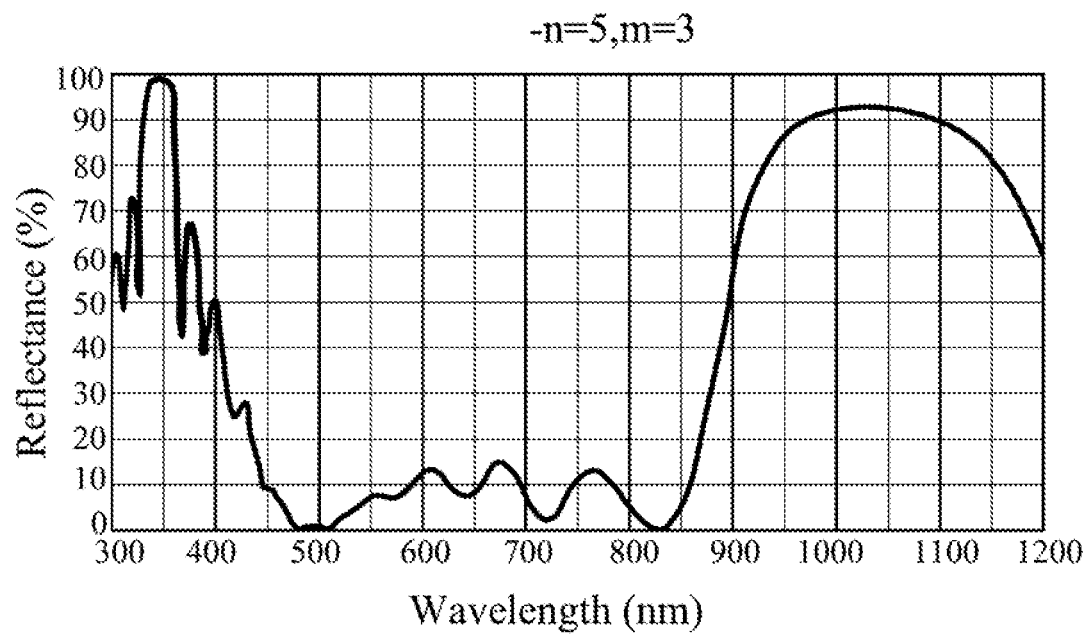
Figure 13:
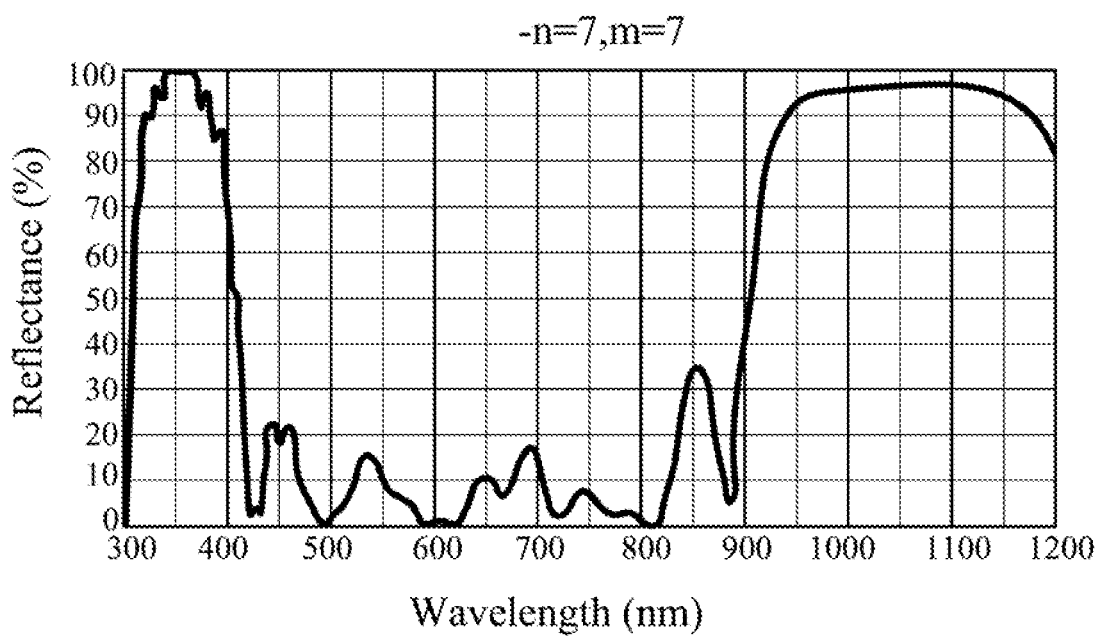
Figure 14:
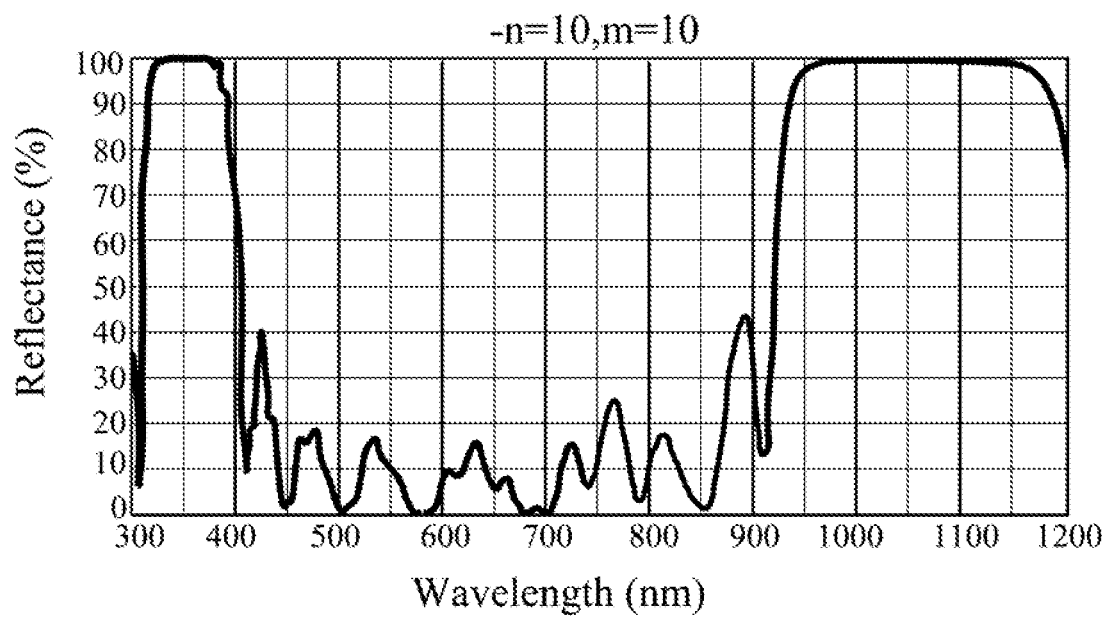
Figure 15:
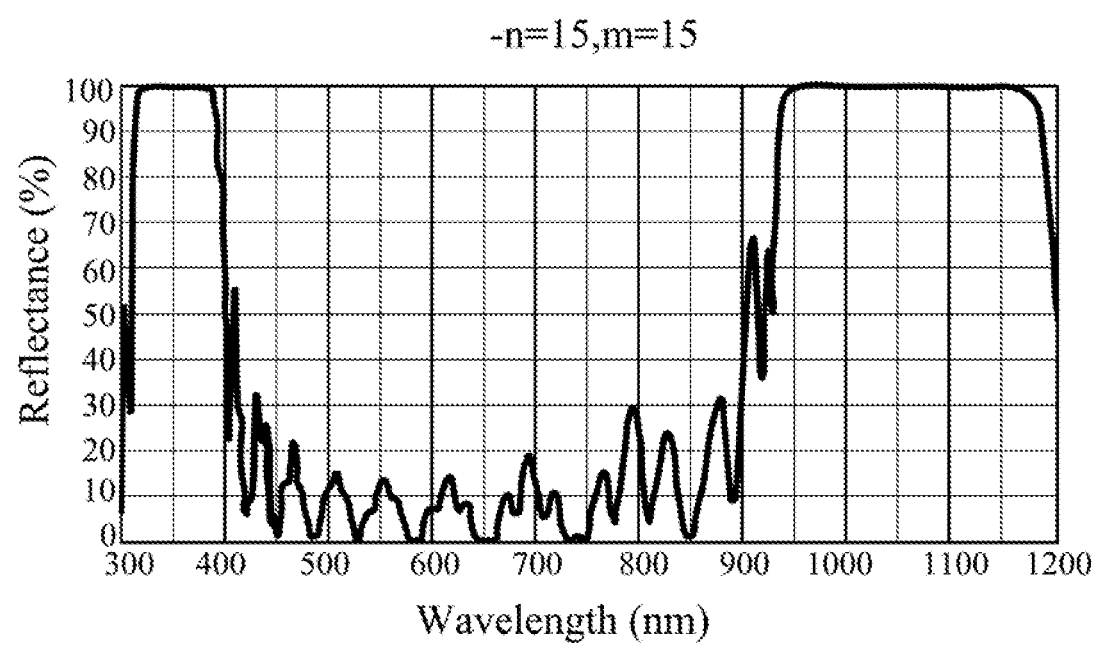

|    |        | n  | m  | R1 (%) | R2 (%) | R3 (%)   |
|----|--------|----|----|--------|--------|----------|
| E1 | FIG. 7 | 3  | —  | <10    | ~70    | 50 to 70 |
| E2 | FIG. 8 | 5  | —  | <20    | ~90    | 60 to 90 |
| E3 | FIG. 9 | —  | 3  | <30    | <10    | 60 to 70 |
| E4 | FIG. 10| —  | 5  | <30    | <10    | 80 to 90 |
| E5 | FIG. 11| 3  | 2  | <30    | 55 to 70 | 80 to 90 |
| E6 | FIG. 12| 5  | 3  | <30    | >90    | 80 to 95 |
| E7 | FIG. 13| 7  | 7  | <30    | >95    | >95      |
| E8 | FIG. 14| 10 | 10 | <25    | ~99    | ~99      |
| E9 | FIG. 15| 15 | 15 | <30    | ~99    | ~99      |

Note:
"—" indicates not applicable.

As shown in Table 1, each of the DBR structures 110 of E1 to E9 exhibits a reflectance of not greater than 30% (such as less than 20% or even 10% in E1 and E2) for light having wavelength of about 400 nm to about 800 nm, indicating the DBR structure 110 of the LED according to this disclosure is capable of allowing passage of a majority of the light emitted from the semiconductor layered structure 130 (e.g., blue light, cyan light, green light).

In addition, each of the DBR structures 110 of E1 to E9 exhibits a reflectance of not lower than 50% (such as not lower than 60%, even 80% or about 90%) for light having wavelength of 350±20 nm, indicating that the DBR structure 110 of the LED structure is capable of effectively reflecting a laser beam used for laser scribing (365±35 nm) on the semiconductor layered structure 130, so as to prevent the laser beam from damaging the upper surface S1*l* of the substrate 100 during the manufacturing processes thereof. Additionally the DBR structures 110 of E1, E2 and E5 to E9 even exhibit a reflectance of greater than 50%, such as approximately 70%, or even approximately 90%, for light having a wavelength of 1000 nm to 1100 nm, which is highly conducive to preventing the laser beam used in stealth dicing from damaging the semiconductor layered structure 130.

Therefore, during the stealth dicing process of the LED of this disclosure, the laser beam can be focused at a location more adjacent to the semiconductor layered structure 130, and may scan the substrate 110 more times without causing damage to the semiconductor layered structure 130 due to the presence of the DBR structure 100, such that the side surface S13 of the substrate 100 can have an improved roughness, so as to increase the light extraction efficiency of the LED of this disclosure. Furthermore, it can be inferred from the results of E5 to E9 that when n≥5 and m≥3, the DBR structures 110 exhibit R1, R2, R3 values that are at a good compromise, each of the values having satisfactory reflectance at different wavelengths.

To conclude, by including the DBR structure 110 having a reflectance of not greater than 30% for the light emitted from the semiconductor layered structure 130, and a reflectance of not smaller than 50% for a laser beam used for desired dicing process (with a wavelength different from the light emitted from the semiconductor layered structure 130), the LED according to the disclosure can be manufactured by adopting different laser dicing process without damaging the substrate 100 and the semiconductor layered structure 130.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A light-emitting diode (LED), comprising:
    a substrate which has an upper surface, a lower surface that is opposite to said upper surface, and a side surface connecting said upper surface and said lower surface;
    a distributed Bragg reflector (DBR) structure which is disposed on said upper surface of said substrate; and
    a semiconductor layered structure which is disposed on said DBR structure opposite to said substrate, and which is configured to emit a light having a first wavelength;
    wherein said DBR structure has a reflectance of not greater than 30% for the light having the first wavelength, and a reflectance of not smaller than 50% for a laser beam having a second wavelength that is different from the first wavelength.

2. The LED of claim 1, wherein the first wavelength ranges from 400 nm to 800 nm.

3. The LED of claim 1, wherein the laser beam having the second wavelength is used for a dicing process.

4. The LED of claim 1, wherein the second wavelength is one of 365±35 nm and 1064±100 nm.

5. The LED of claim 1, wherein said DBR structure includes a first layered unit which includes a plurality of pairs of layers, said layers in each pair including a first high refractive index layer and a first low refractive index layer, said first high refractive index layers and said first low refractive index layers in said first layered unit being alternately stacked.

6. The LED of claim 5, wherein said DBR structure further includes a second layered unit disposed on said first layered unit opposite to said substrate, said second layered unit including a plurality of pairs of layers, said layers in each pair including a second high refractive index layer and a second low refractive index layer, said second high refractive index layers and said second low refractive index layers in said second layered unit being alternately stacked, and wherein for said second layered unit, each of said second high refractive index layers having an optical thickness different from that of each of said first high refractive index layers, and each of said second low refractive index layers having an optical thickness different from that of each of said first low refractive index layers.

7. The LED of claim 5, wherein each of said first high refractive index layers is made of a material selected from the group consisting of $TiO_2$, $Nb_2O_5$, $Ta_2O_5$, $HfO_2$, $ZrO_2$, ZnO, $LaTiO_3$, and combinations thereof, and each of said first low refractive index layers is made of a material selected from the group consisting of $SiO_2$, $MgF_2$, $Al_2O_5$, SiON, and combinations thereof.

8. The LED of claim 6, wherein each of said second high refractive index layers is made of a material selected from the group consisting of $TiO_2$, $Nb_2O_5$, $Ta_2O_5$, $HfO_2$, $ZrO_2$, ZnO, $LaTiO_3$, and combinations thereof, and each of said second low refractive index layers is made of a material selected from the group consisting of $SiO_2$, $MgF_2$, $Al_2O_5$, SiON, and combinations thereof.

9. The LED of claim 6, wherein each of said first high refractive index layers and said first low refractive index layers has an optical thickness of $(¼) \times k_1 \times \lambda_1$, wherein 1000 nm$<\lambda_1<$1200 nm, and $k_1$ is an odd number.

10. The LED of claim 6, wherein each of said second high refractive index layers and said second low refractive index layers has an optical thickness of $(¼) \times k_2 \times \lambda_2$, wherein 350 nm$<\lambda_2<$380 nm, and $k_2$ is an odd number.

11. The LED of claim 6, wherein said first layered unit includes n pairs of layers, and n≥3.

12. The LED of claim 6, wherein said second layered unit includes m pairs of layers, and n≥2.

13. The LED of claim 1, further comprising a buffer layer which is made of an AlN-based material, and which is disposed between said semiconductor layered structure and said DBR structure.

14. The LED of claim 1, wherein said semiconductor layered structure is tapered inwardly toward said DBR structure.

15. The LED of claim 1, wherein said side surface of said substrate has multiple inscribed features of stealth dicing.

16. The LED of claim 15, wherein one of the inscribed features that is most adjacent to said upper surface being spaced apart therefrom by a distance less than 20 μm.

17. A method of producing an LED, comprising the steps of:
(a) providing a substrate which has an upper surface, a lower surface that is opposite to the upper surface, and a side surface interconnecting the upper surface and the lower surface;
(b) forming a DBR structure on the upper surface of the substrate; and
(c) forming a semiconductor layered structure on the DBR structure opposite to the substrate, the semiconductor layered structure being configured to emit a light having a first wavelength;
wherein the DBR structure has a reflectance of not greater than 30% for the light having the first wavelength, and a reflectance of not smaller than 50% for a laser beam having a second wavelength which is different from the first wavelength.

18. The method of claim 17, further comprising at least one of the steps of:
(d) performing laser scribing on the semiconductor layered structure using a first laser beam; and
(e) performing stealth dicing from the lower surface of the substrate using a second laser beam different from the first laser beam;
wherein the reflectance of the DBR structure to each of the first and second laser beams is not smaller than 50%.

19. The method of claim 18, wherein the second wavelength of the first laser beam is 365±35 nm, and the second wavelength of the second laser beam is 1064±100 nm.

20. The method of claim 17, further comprising, before step (c), a step of forming a buffer layer made of an AlN-based material on the DBR structure opposite to the substrate, and in step (c), the semiconductor layered structure being formed on the buffer layer opposite to the DBR structure.

* * * * *